(12) United States Patent
Kang et al.

(10) Patent No.: US 11,013,114 B2
(45) Date of Patent: May 18, 2021

(54) PRINTED CIRCUIT BOARD

(71) Applicant: Samsung Electro-Mechanics Co., Ltd., Suwon-si (KR)

(72) Inventors: Seon-Ha Kang, Suwon-si (KR); Sa-Yong Lee, Suwon-si (KR); Mi-Sun Hwang, Suwon-si (KR); Ju-Ho Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/661,051

(22) Filed: Oct. 23, 2019

(65) Prior Publication Data

US 2020/0170110 A1    May 28, 2020

(30) Foreign Application Priority Data

Nov. 27, 2018  (KR) .......................... 10-2018-0148291

(51) Int. Cl.
*H05K 1/11* (2006.01)
*H05K 3/42* (2006.01)

(52) U.S. Cl.
CPC ............. *H05K 1/115* (2013.01); *H05K 1/112* (2013.01); *H05K 1/118* (2013.01); *H05K 3/422* (2013.01); *H05K 3/423* (2013.01)

(58) Field of Classification Search
CPC .................. H05K 1/11–118; H05K 3/422–429
See application file for complete search history.

(56) References Cited

U.S. PATENT DOCUMENTS

| | | | |
|---|---|---|---|
| 6,326,559 B1* | 12/2001 | Yoshioka | H05K 3/0035 174/255 |
| 7,838,779 B2* | 11/2010 | Yamamichi | H01L 21/486 174/264 |
| 2008/0060838 A1* | 3/2008 | Chen | H01L 21/4857 174/262 |
| 2011/0024180 A1* | 2/2011 | Ko | H05K 3/4007 174/263 |
| 2012/0006592 A1* | 1/2012 | Ouchi | H01L 23/49816 174/267 |
| 2012/0103667 A1* | 5/2012 | Ito | H05K 3/108 174/257 |
| 2012/0138336 A1* | 6/2012 | Watanabe | H05K 3/107 174/250 |
| 2018/0151530 A1* | 5/2018 | Chen | H01L 24/19 |

* cited by examiner

*Primary Examiner* — Hoa C Nguyen
(74) *Attorney, Agent, or Firm* — NSIP Law

(57) ABSTRACT

A printed circuit board is provided. The printed circuit board includes an insulating material, and a circuit comprising a first region that partially penetrates the insulating material, and a second region formed on the first region and that protrudes from an upper portion of the insulating material, the first region includes a first electroplating layer and a first electroless plating layer that are formed between the insulating material and the first electroplating layer.

20 Claims, 16 Drawing Sheets

PRINTED CIRCUIT BOARD

CROSS-REFERENCE TO RELATED APPLICATIONS

This application claims the benefit under 35 U.S.C. 119(a) of Korean Patent Application No. 10-2018-0148291 filed on Nov. 27, 2018 in the Korean Intellectual Property Office, the entire disclosure of which is incorporated herein by reference for all purposes.

BACKGROUND

1. Field

This disclosure relates to a printed circuit board.

2. Description of Related Art

With the recent miniaturization and the thin form factor of printed circuit boards, the circuits have become more miniaturized, and it may be beneficial for microcircuits to closely adhere to insulating materials. Since the sizes of vias are also becoming smaller, it may be beneficial to utilize technologies other than laser machining, to form the via holes.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a printed circuit board includes an insulating material, and a circuit comprising a first region that partially penetrates the insulating material, and a second region formed on the first region and that protrudes from an upper portion of the insulating material, wherein the first region comprises a first electroplating layer and a first electroless plating layer that is formed between the insulating material and the first electroplating layer.

A width of the first region may be larger than a width of the second region.

The second region may include a second electroplating layer formed integrally with the first electroplating layer on an upper surface of the first electroplating layer.

A width of the second electroplating layer may be smaller than a width of the first electroplating layer.

A width of the first region may be smaller than a width of the second region.

The second region may include a second electroplating layer formed integrally with the first electroplating layer on an upper surface of the first electroplating layer, a metal foil disposed along a circumference of a part of an outer portion of the second electroplating layer, and formed on an upper surface of the insulating material, and a second electroless plating layer formed between the second electroplating layer and the metal foil, and further formed in an integral manner with the first electroless plating layer.

A width of the first region may be the same as a width of the second region.

The second region may include a second electroplating layer formed in an integral manner with the first electroplating layer on an upper surface of the first electroplating layer, and a second electroless plating layer disposed along a circumference of a part of an outer portion of the second electroplating layer, and formed in an integral manner with the first electroless plating layer.

A height of the second electroplating layer may be larger than a height of the second electroless plating layer.

A boundary surface between the first region and the insulating material may be a concavely curved surface.

The printed circuit board may further include a first pad formed in a lower surface of the insulating material, a via hole formed on the first pad, and configured to penetrate the insulating material, a via formed in the via hole, and a second pad formed on an upper surface of the via.

A thickness of the via may be larger than a thickness of the first region, and a thickness of the second region may be the same as a thickness of the second pad.

The first region may be connected to the via, and the second region may be connected to the second pad.

The via may include a third electroless plating layer formed on an inner surface of the via hole and an upper surface of the first pad, and a third electroplating layer formed on the third electroless plating layer.

The second pad may include a fourth electroplating layer formed in an integral manner with the third electroplating layer on an upper surface of the third electroplating layer, a metal foil disposed along a circumference of a part of an outer portion of the third electroplating layer and further formed on an upper surface of the insulating material, and a fourth electroless plating layer formed between the third electroplating layer and the metal foil and further formed in an integral manner with the third electroless plating layer.

The via hole may have a concavely curved surface.

The via hole may penetrate an upper portion of the first pad.

In a general aspect, a method of manufacturing a printed circuit board includes forming a flexible insulating layer, and forming a circuit comprising a first region that partially penetrates the flexible insulating layer, and a second region formed on the first region and that protrudes from an upper portion of the flexible insulating layer, wherein the first region comprises a first electroplating layer and a first electroless plating layer that are formed between the flexible insulating layer and the first electroplating layer.

Other features and aspects will be apparent from the following detailed description, the drawings, and the claims.

Figure 1A:
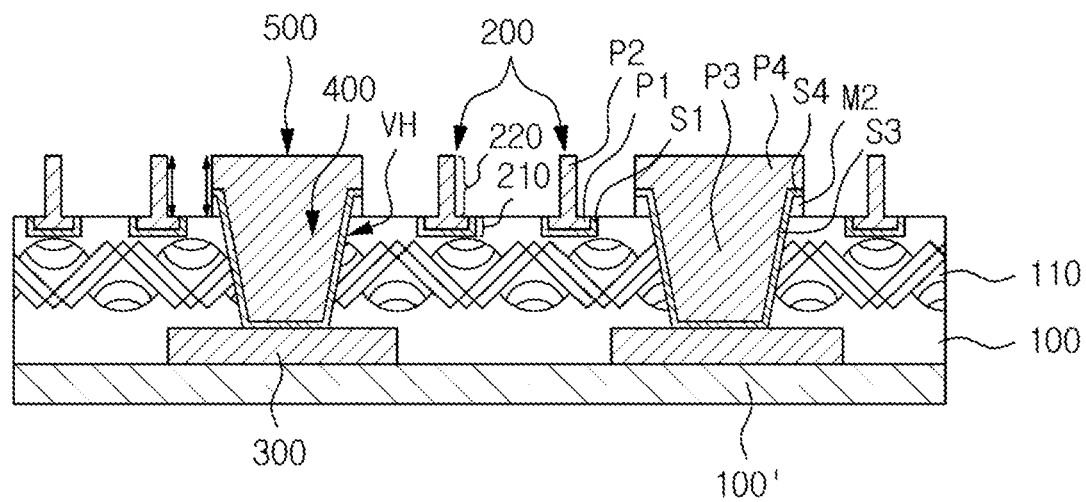
FIGS. 1A to 3B illustrate a printed circuit board according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

A term "couple" may not only refer to an example in which respective components are physically and directly in contact with each other in a contact relationship between the respective components, but may also refer to an example in which another component is interposed between the respective components and the respective components are in contact with the another component.

FIGS. 1A to 3B illustrate an example of a printed circuit board.

Referring to FIG. 1A, a printed circuit board may include an insulating material 100 and a circuit 200. The circuit 200 may include a first region 210 and a second region 220.

The insulating material 100 insulates circuits on the printed circuit board from each other. A main component of the insulating material 100 may be a resin. However, the main component of the insulating material is not limited thereto. As the resin of the insulating material 100, a thermosetting resin, a thermoplastic resin, or similar resin may be selected. The resin of the insulating material 100 may be an epoxy resin, a polyimide resin, a liquid-crystal polymer (LCP) resin, and the like. Here, the epoxy resin may be, but not limited to, a naphthalene-based epoxy resin, a bisphenol-A type epoxy resin, a bisphenol-F type epoxy resin, a novolac-based epoxy resin, a cresol-novolac-based epoxy resin, a rubber-modified epoxy resin, a cycloaliphatic epoxy resin, a silicone-based epoxy resin, a nitrogen-based epoxy resin, a phosphorus-based epoxy resin, or similar epoxy resins.

The insulating material 100 may contain a fiber reinforcement material 110. The fiber reinforcement material 110 contained in the insulating material 100 may be a glass cloth and may include a glass filament, a glass fiber, a glass fabric, and similar glass-based materials. The fiber reinforcement material 110 may be positioned at a central portion of the insulating material 100 and may be formed of a plurality of fibers so as to have a crumpled cloth form. The insulating material 100 including the glass cloth may be a prepreg or an Ajinomoto build-up film (ABF).

The insulating material 100 may contain an inorganic filler, and any one of silica ($SiO_2$), barium sulfate ($BaSO_4$), and alumina ($Al_2O_3$), or a combination of two or more thereof may be used as the inorganic filler. A material of the inorganic filler may also be, but is not limited to, calcium carbonate, magnesium carbonate, fly ash, natural silica, synthetic silica, kaolin, clay, calcium oxide, magnesium oxide, titanium oxide, zinc oxide, calcium hydroxide, aluminum hydroxide, magnesium hydroxide, talc, mica, hydrotalcite, aluminum silicate, magnesium silicate, calcium silicate, calcined talc, wollastonite, potassium titanate, magnesium sulfate, calcium sulfate, magnesium phosphate, or the like.

A thickness of the insulating material 100 may be 100 μm or less, but is not limited thereto.

Meanwhile, FIG. 1A also illustrates an insulating layer 100' stacked beneath the insulating material 100. The insulating layer 100' may be the same layer as the insulating material 100. In addition, the insulating layer 100' may be formed of a material different from the material of the insulating material 100, and may be a core layer, an outer layer (solder resist layer), or the like.

The circuit 200 is a path for transmitting an electric signal and is formed of a conductive material. The first region 210 of the circuit 200 may be embedded in the insulating material 100 while partially penetrating through the insulating material 100. The second region 220 of the circuit 200 may be formed on the first region 210, and may protrude from an upper portion of the insulating material 100. That is, the circuit 200 mat have a structure in which the circuit 200 is semi-embedded in the insulating material 100. The circuit 200 may be formed by blasting, and a depth at which the circuit 200 is embedded may be adjusted depending on a condition of the blasting.

Figure 1B:
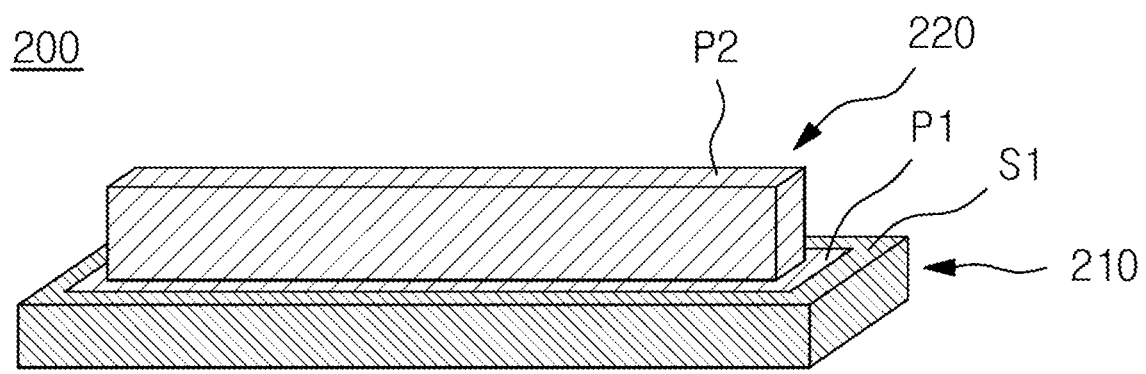

In the example, a width of the first region 210 may be larger than a width of the second region 220. FIG. 1B illustrates the first region 210 and the second region 220 of the circuit 200.

The first region 210 may include a first electroplating layer P1 and a first electroless plating layer S1.

The first electroplating layer P1 occupies the majority of the first region 210 of the circuit 200, and may be a metal plating layer formed in the insulating material 100 by an electroplating method. The first electroplating layer P1 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto.

The first electroless plating layer S1 may be formed in the insulating material 100. Specifically, the first electroless plating layer S1 may be formed entirely between the insulating material 100 and the first electroplating layer P1, and may be a metal plating layer that is formed by an electroless plating method. The first electroplating layer P1 may be grown from the first electroless plating layer S1. Therefore, as illustrated in FIG. 1B, the first electroless plating layer S1 may be formed to surround side surfaces and a lower surface of the first electroplating layer P1, except for an upper surface of the first electroplating layer P1.

The first electroless plating layer S1 may be formed of metal such as copper (Cu), silver (Ag), palladium (Pd), aluminum (Al), nickel (Ni), titanium (Ti), gold (Au), platinum (Pt), or the like, or an alloy thereof. The first electroless plating layer S1 may be formed of the same metal as that of the first electroplating layer P1.

A thickness of the first electroless plating layer S1 may be smaller than a thickness of the first electroplating layer P1, and may be 5 µm or less.

The second region 220 may include a second electroplating layer P2.

The second electroplating layer P2 may be formed integrally with the first electroplating layer P1 on the upper surface of the first electroplating layer P1. The second electroplating layer P2 may be the first electroplating layer P1 extended in an upward direction. The second electroplating layer P2 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto, and may be formed of the same metal as the material of the first electroplating layer P1.

A width of the second electroplating layer P2 may be smaller than a width of the first electroplating layer P1. A horizontal cross-sectional area of the second electroplating layer P2 may be smaller than a horizontal cross-sectional area of the first electroplating layer P1. Therefore, the upper surface of the first electroplating layer P1 may be exposed through an upper surface of the insulating material 100.

Figure 2A:
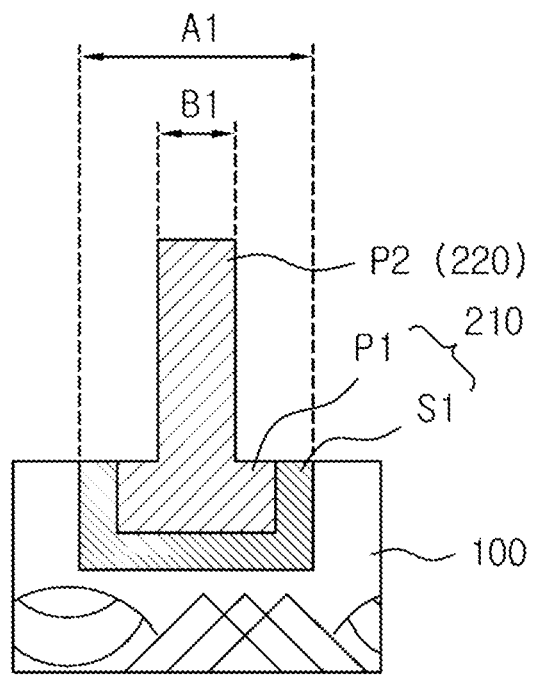

As described above, the width of the first region 210 may be larger than the width of the second region 220. Referring to FIG. 2A, a width A1 of the first region 210 refers to a width of a region including both of the first electroplating layer P1 and the first electroless plating layer S1, and a width B1 of the second region 220 refers to a width of the second electroplating layer P2.

In an example where the first region 210 of the circuit 200 is disposed in the insulating material 100, a contact area between the circuit 200 and the insulating material 100 may be large, which results in an excellent close adhesion between the circuit 200 and the insulating material 100. Further, in an example where the width of the first region 210 is larger than the width of the second region 220, since a width of the circuit 200 is determined depending on the width of the second region 220, a circuit width of the printed circuit board is decreased and a contact area between the circuit 200 and the insulating material 100 may be secured by the first region 210.

Figure 2B:
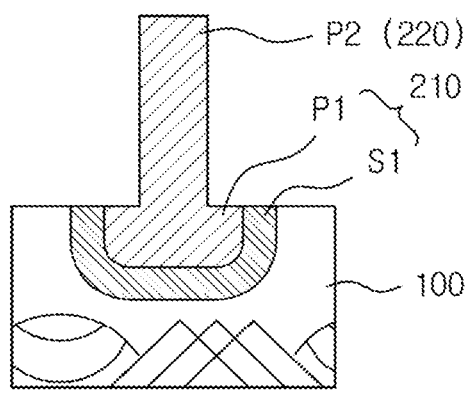

Meanwhile, as illustrated in FIG. 2B, a boundary surface between the first region 210 and the insulating material 100 may be a concavely curved surface (U-letter-shaped curved surface). A curved shape of the boundary surface between the first region 210 and the insulating material 100 may be changed as necessary, and may be adjusted depending on a condition of the blasting.

Referring back to FIG. 1A, the printed circuit board according to an example may further include a first pad 300, a via hole VH, a via 400, and a second pad 500.

The first pad 300 may be formed in a lower surface of the insulating material 100 and may be embedded in the lower surface of the insulating material 100 such that, except for the lower surface of the first pad 300, side surfaces and an upper surface of the first pad 300 may be in contact with the insulating material 100. The first pad 300 may be provided on an end portion of a circuit formed in the lower surface of the insulating material 100.

The first pad 300 may be formed of metal such as copper (Cu), silver (Ag), palladium (Pd), aluminum (Al), nickel (Ni), titanium (Ti), gold (Au), platinum (Pt), or the like, or an alloy thereof, and may be constituted by a plurality of layers formed of a homogeneous metal or heterogeneous metals.

The via hole VH penetrates through the insulating material 100 to be formed on the first pad 300. A horizontal cross-sectional area of the via hole VH may be decreased as the via hole penetrates toward a lower portion of the insulating material 100. Further, although not illustrated in FIG. 1A, an inner surface of the via hole VH may be a concavely curved (U-letter shape) surface (see FIG. 10B). In addition, the via hole VH may partially penetrate through an upper portion of the first pad 300 and an upper surface of the first pad 300 may include a concavely (U-letter shape) curved surface (see FIG. 10B).

The via 400 may be formed of a conductive material and may be formed in the via hole VH. The via 400 may electrically connect circuits in different layers to each other. The via 400 electrically connects the first and second pads 300 and 500 to each other.

The via 400 includes a third electroless plating layer S3 and a third electroplating layer P3. The via 400 may have the same layer structure as that of the first region 210 of the circuit 200.

The third electroless plating layer S3 may be a metal plating layer formed on the inner surface of the via hole VH and a bottom surface (the upper surface of the first pad 300) of the via hole VH. The third electroplating layer P3 may be a metal plating layer grown from the third electroless plating layer S3 and may be formed on the third electroless plating layer S3 and fills the via hole VH. The third electroless plating layer S3 may be formed at the same thickness as the thickness of the first electroless plating layer S1 of the first region 210 of the circuit 200, and the third electroplating layer P3 may be formed to be thicker than the third electroless plating layer S3.

Meanwhile, each of the third electroless plating layer S3 and the third electroplating layer P3 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto.

Figure 3A:
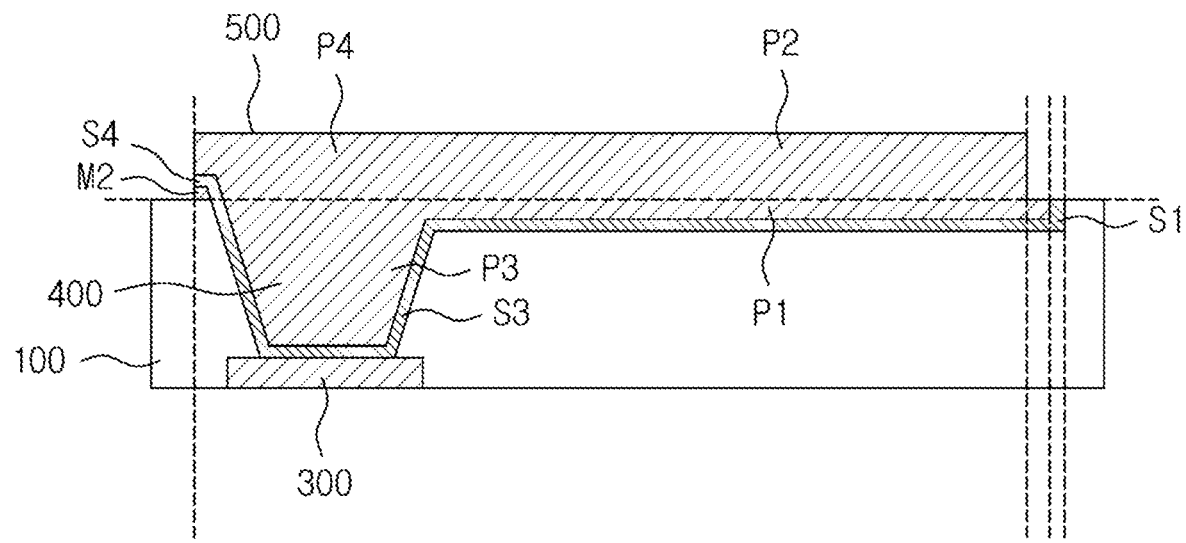

The second pad 500 may be formed on an upper surface of the via 400 and may be connected to an end portion of the circuit 200 as illustrated in FIG. 3A.

The second pad 500 may include a metal foil M2, a fourth electroless plating layer S4, and a fourth electroplating layer P4.

The metal foil M2 may be formed on the upper surface of the insulating material 100, and may be formed in a ring shape (for example, an opened ring shape (C-letter shape)) along a circumference of the upper surface of the via 400. The metal foil M2 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto.

The fourth electroless plating layer S4 may be formed on an upper surface and an inner surface of the metal foil M2, and may be formed integrally with the third electroless plating layer S3 of the via 400. A side surface of the fourth electroless plating layer S4 may be exposed through a side surface of the second pad 500.

The fourth electroplating layer P4 may be a metal plating layer grown from the fourth electroless plating layer S4 and may be formed integrally with the third electroplating layer P3 on the upper surface of the third electroplating layer P3 of the via 400. The fourth electroplating layer P4 may also be formed on the fourth electroless plating layer S4 disposed on the upper surface of the metal foil M2. In this example, the metal foil M2 may be formed along a circumference of a part of an outer portion of the fourth electroplating layer P4, and the fourth electroless plating layer S4 may be interposed between the metal foil M2 and the fourth electroplating layer P4.

A height of the second pad 500 may be determined depending on a thickness of each of the metal foil M2, the fourth electroless plating layer S4, and the fourth electroplating layer P4, and may be the same as a height of the second region 220 of the circuit 200.

Figure 3B:
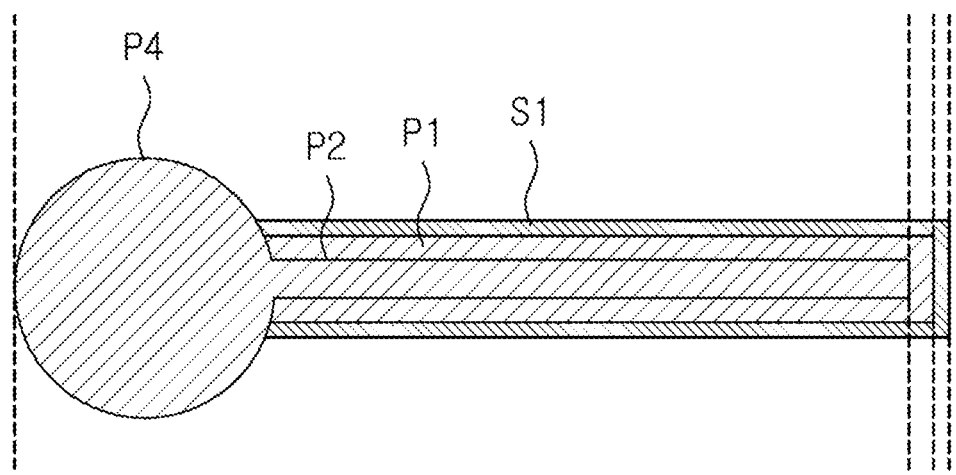

Referring to FIGS. 3A and 3B, in an example where the second pad 500 is provided on an end portion of the circuit 200, the third electroless plating layer S3 of the via 400 may be connected to the first electroless plating layer S1 of the circuit 200. Here, the third electroless plating layer S3 of the via 400 and the first electroless plating layer S1 of the circuit 200 may be formed integrally with each other.

The third electroplating layer P3 of the via 400 and the first electroplating layer P1 of the circuit 200 may be connected to each other and may be formed integrally with each other. Further, the fourth electroplating layer P4 of the second pad 500 and the second electroplating layer P2 of the circuit 200 may be connected to each other and formed integrally with each other.

FIGS. 4A to 5B illustrate a printed circuit board according to an example.

Figure 4A:
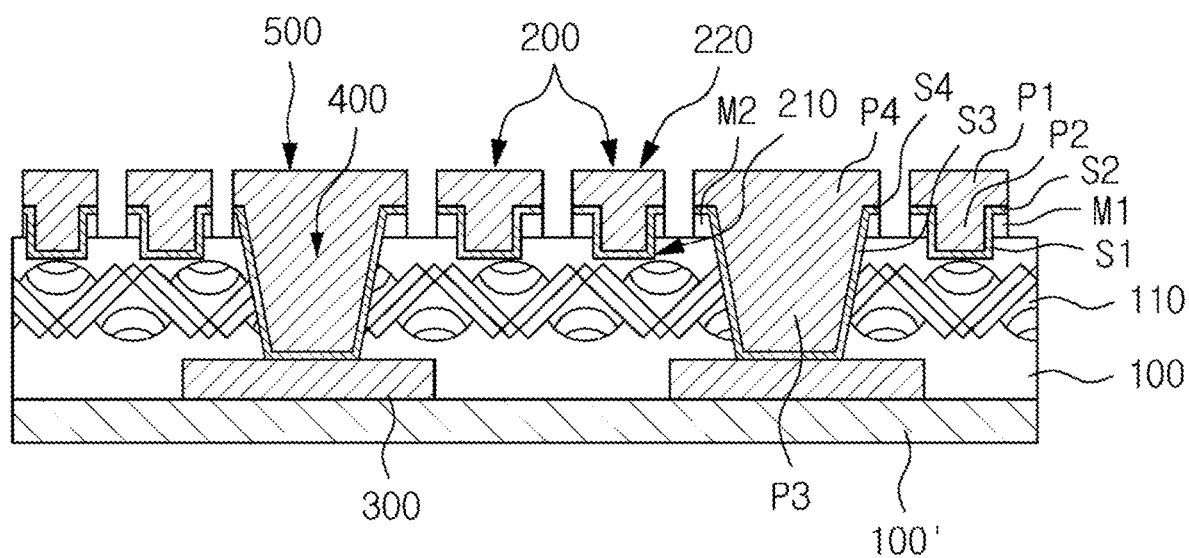
FIGS. 4A to 5B illustrate a printed circuit board according to an example.

Referring to FIG. 4A, a printed circuit board according to an example includes an insulating material 100 and a circuit 200. The circuit 200 may include a first region 210 and a second region 220.

The insulating material 100 insulates circuits on the printed circuit board from each other. A main component of the insulating material 100 may be a resin. However, the main component of the insulating material 100 is not limited thereto. As the resin of the insulating material 100, a thermosetting resin, a thermoplastic resin, or the like may be selected. The resin of the insulating material 100 may be an epoxy resin, a polyimide resin, a liquid-crystal polymer (LCP) resin, and the like. Here, the epoxy resin may be, but not limited to, a naphthalene-based epoxy resin, a bisphenol-A type epoxy resin, a bisphenol-F type epoxy resin, a novolac-based epoxy resin, a cresol-novolac-based epoxy resin, a rubber-modified epoxy resin, a cycloaliphatic epoxy resin, a silicone-based epoxy resin, a nitrogen-based epoxy resin, a phosphorus-based epoxy resin, or similar epoxy resin.

The insulating material 100 may contain a fiber reinforcement material 110. The fiber reinforcement material 110 contained in the insulating material 100 may be a glass cloth and may include a glass filament, a glass fiber, a glass fabric, and similar glass-based materials. The fiber reinforcement material 110 may be positioned at a central portion of the insulating material 100 and may be formed of a plurality of fibers so as to have a crumpled cloth form. The insulating material 100 including the glass cloth may be a prepreg or an Ajinomoto build-up film (ABF).

The insulating material 100 may contain an inorganic filler, and any one of silica ($SiO_2$), barium sulfate ($BaSO_4$), and alumina ($Al_2O_3$), or a combination of two or more thereof may be used as the inorganic filler. A material of the inorganic filler may also be, but not limited to, calcium carbonate, magnesium carbonate, fly ash, natural silica, synthetic silica, kaolin, clay, calcium oxide, magnesium oxide, titanium oxide, zinc oxide, calcium hydroxide, aluminum hydroxide, magnesium hydroxide, talc, mica, hydrotalcite, aluminum silicate, magnesium silicate, calcium silicate, calcined talc, wollastonite, potassium titanate, magnesium sulfate, calcium sulfate, magnesium phosphate, or the like.

A thickness of the insulating material 100 may be 100 μm or less, but is not limited thereto. The thickness of the insulating material may be greater than 100 μm.

Meanwhile, FIG. 4A also illustrates an insulating layer 100' stacked beneath the insulating material 100. The insulating layer 100' may be the same layer as the insulating material 100. In addition, the insulating layer 100' may be formed of a material different from a material of the insulating material 100, and may be a core layer, an outer layer (solder resist layer), or the like.

The circuit 200 is a path for transmitting an electric signal and is formed of a conductive material. The first region 210 of the circuit 200 may be embedded in the insulating material 100 while partially penetrating through a portion of the insulating material 100. The second region 220 of the circuit 200 may be formed on the first region 210 and protrudes from an upper portion of the insulating material 100. That is, the circuit 200 has a structure in which the circuit 200 is partially embedded in the insulating material 100. The circuit 200 may be formed by blasting, and a depth at which the circuit 200 is embedded may be adjusted depending on a condition of the blasting.

Figure 4B:
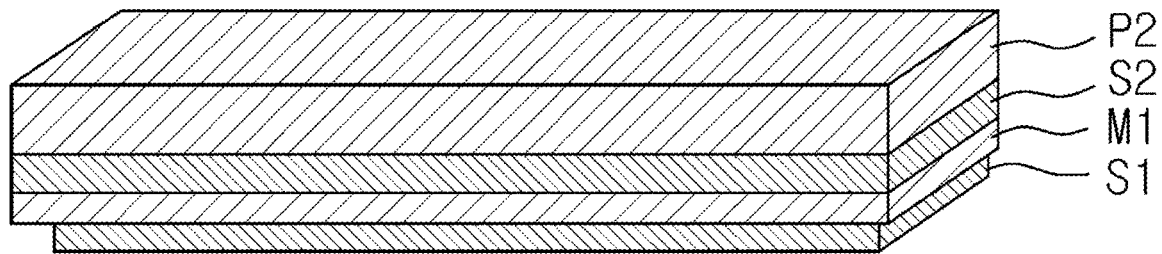

In the example, a width of the first region 210 may be smaller than a width of the second region 220. FIG. 4B illustrates the first region 210 and the second region 220 of the circuit 200.

The first region 210 includes a first electroplating layer P1 and a first electroless plating layer S1.

The first electroplating layer P1 occupies the majority of the first region 210 of the circuit 200, and may be a metal plating layer formed in the insulating material 100 by an electroplating method. The first electroplating layer P1 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto.

The first electroless plating layer S1 may be formed in the insulating material 100. Specifically, first electroless plating layer S1 may be formed entirely between the insulating material 100 and the first electroplating layer P1, and may be a metal plating layer formed by an electroless plating method. The first electroplating layer P1 may be grown from the first electroless plating layer S1. Therefore, as illustrated in FIG. 4B, the first electroless plating layer S1 may be formed to surround side surfaces and a lower surface of the first electroplating layer P1, except for an upper surface of the first electroplating layer P1.

The first electroless plating layer S1 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto. The first electroless plating layer S1 may be formed of the same metal as that of the first electroplating layer P1.

A thickness of the first electroless plating layer S1 may be smaller than a thickness of the first electroplating layer P1, and may be 5 µm or less.

The second region 220 may include a metal foil M1, a second electroless plating layer S2, and a second electroplating layer P2.

The metal foil M1 may be formed on an upper surface of the insulating material 100 and may be formed in a ring shape along a circumference of an upper surface of the first region 210 of the circuit 200. The metal foil M1 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto.

The second electroless plating layer S2 may be formed on an upper surface and an inner surface of the metal foil M1, and may be formed integrally with the first electroless plating layer S1 of the first region 210 of the circuit 200.

The second electroplating layer P2 may be a metal plating layer grown from the second electroless plating layer S2 and is formed integrally with the first electroplating layer P1 on the upper surface of the first electroplating layer P1 of the first region 210 of the circuit 200. The second electroplating layer P2 is also formed on the second electroless plating layer S2 disposed on the upper surface of the metal foil M1. In this example, the metal foil M1 may be formed along a circumference of a part of an outer portion of the second electroplating layer P2, and the second electroless plating layer S2 may be interposed between the metal foil M1 and the second electroplating layer P2.

The second electroplating layer P2 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto. The second electroplating layer P2 may be formed of the same metal as the material of the first electroplating layer P1.

Figure 5A:
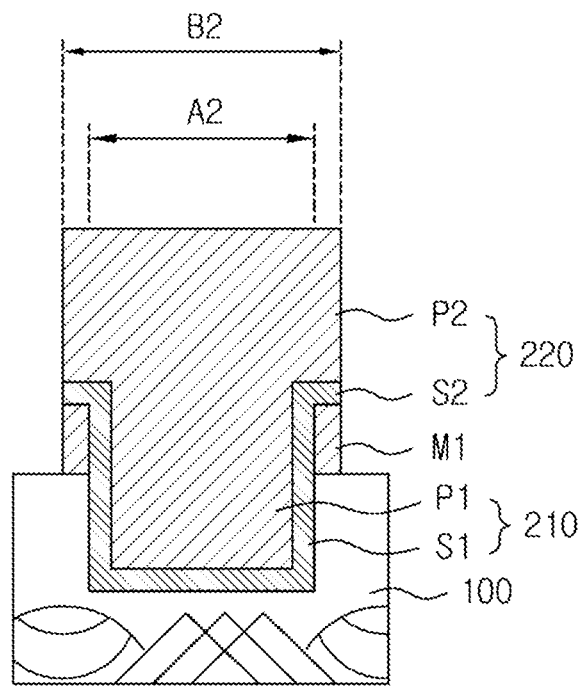

As described above, the width of the first region 210 may be smaller than the width of the second region 220. Referring to FIG. 5A, a width A2 of the first region 210 may refer to a width of a region including both of the first electroplating layer P1 and the first electroless plating layer S1, and a width B2 of the second region 220 means a width of a region including all of the metal foil M1, the second electroplating layer P2, and the second electroless plating layer S2. It should be noted that the width B2 of the second region 220 may be the same as a width of the second electroplating layer P2.

In an example where the first region 210 of the circuit 200 is disposed in the insulating material 100, a contact area between the circuit 200 and the insulating material 100 may be large, which results in an excellent close adhesion between the circuit 200 and the insulating material 100. Further, in an example where the second region 220 is larger than the first region 210, a size of an upper surface of the second region 220 may be sufficiently secured. For example, in an example where at least a portion of the circuit 200 functions as a connection pad, it is preferable that the size of the upper surface of the second region 220 is sufficiently secured in terms of connection reliability.

Figure 5B:
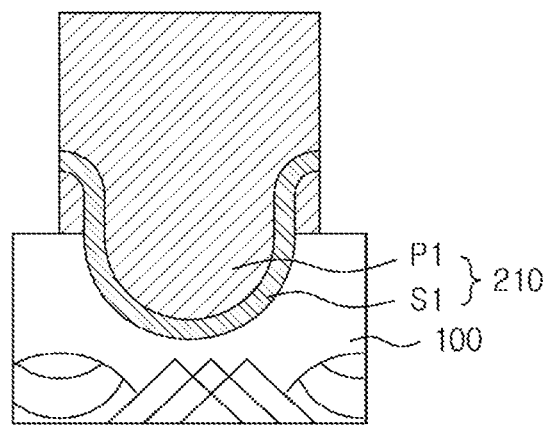

Meanwhile, as illustrated in FIG. 5B, a boundary surface between the first region 210 and the insulating material 100 may be a concavely curved surface (U-letter-shaped curved surface). A curved shape of the boundary surface between the first region 210 and the insulating material 100 may be changed as necessary, and may be adjusted depending on a condition of the blasting.

Referring back to FIG. 4A, the printed circuit board according to the example may further include a first pad 300, a via hole VH, a via 400, and a second pad 500.

The first pad 300 may be formed in a lower surface of the insulating material 100 and may be embedded in the lower surface of the insulating material 100 such that, except for the lower surface of the first pad 300, side surfaces and an upper surface of the first pad 300 may be in contact with the insulating material 100. The first pad 300 may be provided on an end portion of a circuit formed in the lower surface of the insulating material 100.

The first pad 300 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto. The first pad 300 may be constituted by a plurality of layers formed of a homogeneous metal or heterogeneous metals.

The via hole VH penetrates through the insulating material 100 to be formed on the first pad 300. A horizontal cross-sectional area of the via hole VH may be decreased toward a lower portion of the insulating material 100. Further, although not illustrated in FIG. 4A, an inner surface of the via hole VH may be a concavely curved (U-letter shape) surface (see FIG. 10B). In addition, the via hole VH may partially penetrate through an upper portion of the first pad 300 and the upper surface of the first pad 300 may include a concavely (U-letter shape) curved surface (see FIG. 10B).

The via 400 is formed of a conductive material and formed in the via hole VH and electrically connects circuits in different layers to each other. The via 400 electrically connects the first and second pads 300 and 500 to each other.

The via 400 includes a third electroless plating layer S3 and a third electroplating layer P3. The via 400 may have the same layer structure as the layer structure of the first region 210 of the circuit 200.

The third electroless plating layer S3 is a metal plating layer formed on the inner surface of the via hole VH and a bottom surface (the upper surface of the first pad 300) of the via hole VH. The third electroplating layer P3 is a metal plating layer grown from the third electroless plating layer S3 and is formed on the third electroless plating layer S3 and fills the via hole VH. The third electroless plating layer S3 may be formed at the same thickness as that of the first electroless plating layer S1 of the first region 210 of the circuit 200, and the third electroplating layer P3 may be formed to be thicker than the third electroless plating layer S3.

Meanwhile, each of the third electroless plating layer S3 and the third electroplating layer P3 may be formed of metal such as copper (Cu), silver (Ag), palladium (Pd), aluminum (Al), nickel (Ni), titanium (Ti), gold (Au), platinum (Pt), or the like, or an alloy thereof.

The second pad 500 is formed on an upper surface of the via 400 and may be connected to an end portion of the circuit 200.

The second pad 500 may include a metal foil M2, a fourth electroless plating layer S4, and a fourth electroplating layer P4. The second pad 500 may have the same layer structure as the layer structure of the second region 220 of the circuit 200.

The metal foil M2 may be formed on the upper surface of the insulating material 100, and may be formed in a ring shape (particularly, the metal foil M1 and the metal foil M2 may be integrally formed in a closed ring shape (O-letter shape)) along a circumference of the upper surface of the via 400. The metal foil M2 may be formed of metal such as copper (Cu), silver (Ag), palladium (Pd), aluminum (Al), nickel (Ni), titanium (Ti), gold (Au), platinum (Pt), or the like, or an alloy thereof.

The fourth electroless plating layer S4 may be formed on an upper surface and an inner surface of the metal foil M2, and may be formed integrally with the third electroless plating layer S3 of the via 400. A side surface of the fourth electroless plating layer S4 is exposed through a side surface of the second pad 500.

The fourth electroplating layer P4 is a metal plating layer grown from the fourth electroless plating layer S4 and is formed integrally with the third electroplating layer P3 on the upper surface of the third electroplating layer P3 of the via 400. The fourth electroplating layer P4 is also formed on the fourth electroless plating layer S4 disposed on the upper surface of the metal foil M2. In this example, the metal foil M2 may be formed along a circumference of a part of an outer portion of the fourth electroplating layer P4, and the fourth electroless plating layer S4 may be interposed between the metal foil M2 and the fourth electroplating layer P4.

A height of the second pad 500 may be determined depending on a thickness of each of the metal foil M2, the fourth electroless plating layer S4, and the fourth electroplating layer P4, and may be the same as a height of the second region 220 of the circuit 200.

In an example where the second pad 500 is provided on an end portion of the circuit 200, the third electroless plating layer S3 of the via 400 may be connected to the first electroless plating layer S1 of the circuit 200. The fourth electroless plating layer S4 of the second pad 500 may be connected to the second electroless plating layer S2 of the circuit 200. Here, the third electroless plating layer S3 of the via 400 and the first electroless plating layer S1 of the circuit 200 are formed integrally with each other, and the fourth electroless plating layer S4 and the second electroless plating layer S2 may be formed integrally with each other.

Further, the third electroplating layer P3 of the via 400 and the first electroplating layer P1 of the circuit 200 may be connected to each other and formed integrally with each other. The fourth electroplating layer P4 of the second pad 500 and the second electroplating layer P2 of the circuit 200 may be connected to each other and formed integrally with each other. In addition, the metal foil M2 of the second pad 500 may be connected to the metal foil M1 of the circuit 200.

FIGS. 6A to 7B illustrate a printed circuit board according to an example.

Figure 6A:
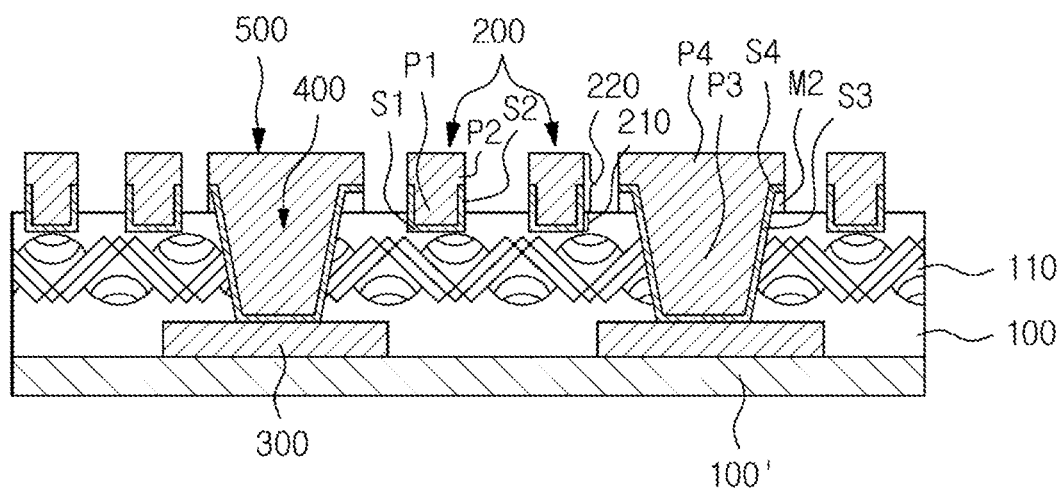
FIGS. 6A to 7B illustrate a printed circuit board according to an example.

Referring to FIG. 6A, a printed circuit board according to an example includes an insulating material 100 and a circuit 200. The circuit 200 may include a first region 210 and a second region 220.

The insulating material 100 insulates circuits on the printed circuit board from each other. A main component of the insulating material 100 may be a resin. However, the main component of the insulating material 100 is not limited thereto. As the resin of the insulating material 100, a thermosetting resin, a thermoplastic resin, or the like may be selected. The resin of the insulating material 100 may be an epoxy resin, a polyimide resin, a liquid-crystal polymer (LCP) resin, and the like. Here, the epoxy resin may be, but not limited to, a naphthalene-based epoxy resin, a bisphenol-A type epoxy resin, a bisphenol-F type epoxy resin, a novolac-based epoxy resin, a cresol-novolac-based epoxy resin, a rubber-modified epoxy resin, a cycloaliphatic epoxy resin, a silicone-based epoxy resin, a nitrogen-based epoxy resin, a phosphorus-based epoxy resin, or similar resins.

The insulating material 100 may contain a fiber reinforcement material 110. The fiber reinforcement material 110 contained in the insulating material 100 may be a glass cloth and may include a glass filament, a glass fiber, a glass fabric, and similar glass-based materials. The fiber reinforcement material 110 may be positioned at a central portion of the insulating material 100 and formed of a plurality of fibers so as to have a crumpled cloth form. The insulating material 100 including the glass cloth may be a prepreg or an Ajinomoto build-up film (ABF).

The insulating material 100 may contain an inorganic filler, and any one of silica ($SiO_2$), barium sulfate ($BaSO_4$), and alumina ($Al_2O_3$), or a combination of two or more thereof may be used as the inorganic filler. A material of the inorganic filler may also be, but not limited to, calcium carbonate, magnesium carbonate, fly ash, natural silica, synthetic silica, kaolin, clay, calcium oxide, magnesium oxide, titanium oxide, zinc oxide, calcium hydroxide, aluminum hydroxide, magnesium hydroxide, talc, mica, hydrotalcite, aluminum silicate, magnesium silicate, calcium silicate, calcined talc, wollastonite, potassium titanate, magnesium sulfate, calcium sulfate, magnesium phosphate, or the like.

A thickness of the insulating material 100 may be 100 μm or less, but is not limited thereto. A thickness of the insulating material 100 may be greater than 100 μm.

Meanwhile, FIG. 6A also illustrates an insulating layer 100' stacked beneath the insulating material 100, and the insulating layer 100' may be the same layer as the insulating material 100. In addition, the insulating layer 100' may be formed of a material different from a material of the insulating material 100, and may be a core layer, an outer layer (solder resist layer), or the like.

The circuit 200 is a path for transmitting an electric signal and is formed of a conductive material. The first region 210 of the circuit 200 is embedded in the insulating material 100 while partially penetrating through the insulating material 100 and the second region 220 of the circuit 200 may be formed on the first region 210, and protrudes from an upper portion of the insulating material 100. That is, the circuit 200 has a structure in which the circuit 200 is partially embedded in the insulating material 100. The circuit 200 may be formed by blasting, and a depth at which the circuit 200 is embedded may be adjusted depending on a condition of the blasting.

Figure 6B:

In the example, a width of the first region 210 may be the same as a width of the second region 220. FIG. 6B illustrates the first region 210 and the second region 220 of the circuit 200.

The first region 210 includes a first electroplating layer P1 and a first electroless plating layer S1.

The first electroplating layer P1 occupies the majority of the first region 210 of the circuit 200, and is a metal plating layer formed in the insulating material 100 by an electroplating method. The first electroplating layer P1 may be formed of metal such as copper (Cu), silver (Ag), palladium (Pd), aluminum (Al), nickel (Ni), titanium (Ti), gold (Au), platinum (Pt), or the like, or an alloy thereof.

The first electroless plating layer S1 is formed in the insulating material 100, specifically, is formed entirely between the insulating material 100 and the first electroplating layer P1, and is a metal plating layer formed by an electroless plating method. The first electroplating layer P1 is grown from the first electroless plating layer S1. Therefore, as illustrated in FIG. 1B, the first electroless plating layer S1 may be formed to surround side surfaces and a lower surface of the first electroplating layer P1, except for an upper surface of the first electroplating layer P1.

The first electroless plating layer S1 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto. The first electroless plating layer S1 may be formed of the same metal as that of the first electroplating layer P1.

A thickness of the first electroless plating layer S1 may be smaller than a thickness of the first electroplating layer P1, and may be 5 μm or less.

The second region 220 may include a second electroless plating layer S2 and a second electroplating layer P2.

The second electroless plating layer S2 may be formed in a ring shape on an edge of an upper surface of the first region 210 of the circuit 200, and may be formed integrally with the first electroless plating layer S1 on the first electroless plating layer S1 of the first region 210 of the circuit 200. The second electroless plating layer S2 may be formed of the same metal as that of the first electroless plating layer S1.

The second electroplating layer P2 may be a metal plating layer grown from the second electroless plating layer S2 and may be formed on an inner side and an upper surface of the second electroless plating layer S2. In this example, the second electroless plating layer S2 may be formed along a circumference of a part of an outer portion of the second electroplating layer P2 and a height of the second electroless plating layer S2 may be smaller than a height of the second region 220. The second electroplating layer P2 may be formed integrally with the first electroplating layer P1 on the upper surface of the first electroplating layer P1 of the first region 210 of the circuit 200.

The second electroless plating layer S2 and the second electroplating layer P2 may be formed of metal such as copper (Cu), silver (Ag), palladium (Pd), aluminum (Al), nickel (Ni), titanium (Ti), gold (Au), platinum (Pt), or the like, or an alloy thereof, but are not limited thereto. The second electroless plating layer S2 and the second electroplating layer P2 may be formed of the same metal as the material of the first electroless plating layer S1 and the first electroplating layer P1.

Figure 7A:
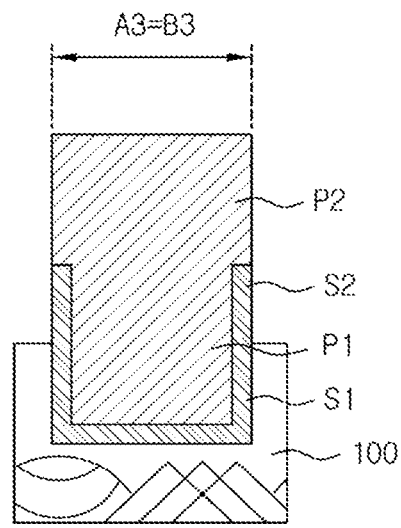

As described above, the width of the first region 210 may be the same as the width of the second region 220. Referring to FIG. 7A, a width A3 of the first region 210 may refer to a width of a region including both of the first electroplating layer P1 and the first electroless plating layer S1, and a width B3 of the second region 220 may refer to a width of a region including both of the second electroplating layer P2 and the second electroless plating layer S2. It should be noted that the width B3 of the second region 220 may be the same as a width of the second electroplating layer P2.

In the example where the first region 210 of the circuit 200 is disposed in the insulating material 100, a contact area between the circuit 200 and the insulating material 100 may be large, which results in an excellent close adhesion between the circuit 200 and the insulating material 100. When it is necessary that the circuit 200 is formed at a uniform width in a vertical direction, the width of the first region 210 and the width of the second region 220 of the circuit 200 may be the same as each other.

Figure 7B:
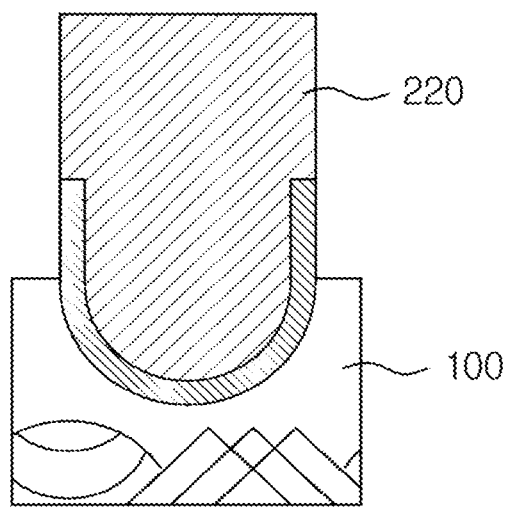

Meanwhile, as illustrated in FIG. 7B, a boundary surface between the first region 210 and the insulating material 100 may be a concavely curved surface (U-letter-shaped curved surface). A curved shape of the boundary surface between the first region 210 and the insulating material 100 may be changed as necessary, and may be adjusted depending on a condition of the blasting.

Referring back to FIG. 6A, the printed circuit board according to the example may further include a first pad 300, a via hole VH, a via 400, and a second pad 500.

The first pad 300 may be formed in a lower surface of the insulating material 100 and may be embedded in the lower surface of the insulating material 100 such that, except for the lower surface of the first pad 300, side surfaces and an upper surface of the first pad 300 may be in contact with the insulating material 100. The first pad 300 may be provided on an end portion of a circuit formed in the lower surface of the insulating material 100.

The first pad 300 may be formed of metal such as copper (Cu), silver (Ag), palladium (Pd), aluminum (Al), nickel (Ni), titanium (Ti), gold (Au), platinum (Pt), or the like, or an alloy thereof, and may be constituted by a plurality of layers formed of a homogeneous metal or heterogeneous metals.

The via hole VH penetrates through the insulating material 100 to be formed on the first pad 300. A horizontal cross-sectional area of the via hole VH may be formed in a tapered manner toward a lower portion of the insulating material 100. Further, although not illustrated in FIG. 6A, an inner surface of the via hole VH may be a concavely curved (U-letter shape) surface (see FIG. 10B). In addition, the via hole VH may partially penetrate through an upper portion of the first pad 300 and the upper surface of the first pad 300 may include a concavely (U-letter shape) curved surface (see FIG. 10B).

The via 400 is formed of a conductive material and formed in the via hole VH. The via 400 may electrically connect circuits in different layers to each other. The via 400 electrically connects the first and second pads 300 and 500 to each other.

The via 400 includes a third electroless plating layer S3 and a third electroplating layer P3. The via 400 may have the same layer structure as the layer structure of the first region 210 of the circuit 200.

The third electroless plating layer S3 is a metal plating layer formed on the inner surface of the via hole VH and a bottom surface (the upper surface of the first pad 300) of the via hole VH. The third electroplating layer P3 is a metal plating layer grown from the third electroless plating layer S3 and is formed on the third electroless plating layer S3 and fills the via hole VH. The third electroless plating layer S3 may be formed at the same thickness as that of the first electroless plating layer S1 of the first region 210 of the circuit 200, and the third electroplating layer P3 may be formed to be thicker than the third electroless plating layer S3.

Meanwhile, each of the third electroless plating layer S3 and the third electroplating layer P3 may be formed of metal such as copper (Cu), silver (Ag), palladium (Pd), aluminum (Al), nickel (Ni), titanium (Ti), gold (Au), platinum (Pt), or the like, or an alloy thereof, but is not limited thereto.

The second pad 500 may be formed on an upper surface of the via 400 and may be connected to an end portion of the circuit 200.

The second pad 500 may include a metal foil M2, a fourth electroless plating layer S4, and a fourth electroplating layer P4.

The metal foil M2 may be formed on the upper surface of the insulating material 100, and may be formed in a ring shape (for example, an opened ring shape (C-letter shape)) along a circumference of the upper surface of the via 400. The metal foil M2 may be formed of metal such as copper (Cu), silver (Ag), palladium (Pd), aluminum (Al), nickel (Ni), titanium (Ti), gold (Au), platinum (Pt), or the like, or an alloy thereof.

The fourth electroless plating layer S4 may be formed on an upper surface and an inner surface of the metal foil M2, and may be formed integrally with the third electroless plating layer S3 of the via 400. (See FIG. 11). A side surface of the fourth electroless plating layer S4 may be exposed through a side surface of the second pad 500.

The fourth electroplating layer P4 is a metal plating layer grown from the fourth electroless plating layer S4, and may be formed integrally with the third electroplating layer P3 on the upper surface of the third electroplating layer P3 of the via 400. The fourth electroplating layer P4 may also be formed on the fourth electroless plating layer S4 disposed on the upper surface of the metal foil M2. In this example, the metal foil M2 may be formed along a circumference of a part of an outer portion of the fourth electroplating layer P4, and the fourth electroless plating layer S4 is interposed between the metal foil M2 and the fourth electroplating layer P4.

A height of the second pad 500 may be determined depending on a thickness of each of the metal foil M2, the fourth electroless plating layer S4, and the fourth electroplating layer P4, and may be the same as a height of the second region 220 of the circuit 200.

In an example where the second pad 500 is provided on an end portion of the circuit 200, the third electroless plating layer S3 of the via 400 may be connected to the first electroless plating layer S1 of the circuit 200. The fourth electroless plating layer S4 of the second pad 500 may be connected to the second electroless plating layer S2 of the circuit 200. Here, the third electroless plating layer S3 of the via 400 and the first electroless plating layer S1 of the circuit 200 may be formed integrally with each other, and the fourth electroless plating layer S4 and the second electroless plating layer S2 may be formed integrally with each other.

Further, the third electroplating layer P3 of the via 400 and the first electroplating layer P1 of the circuit 200 may be connected to each other and formed integrally with each other. The fourth electroplating layer P4 of the second pad 500 and the second electroplating layer P2 of the circuit 200 may be connected to each other and formed integrally with each other.

Hereinafter, a method for manufacturing a printed circuit board will be described.

FIGS. 8 to 15 illustrate a method for manufacturing the printed circuit board according to an example.

Figure 8:
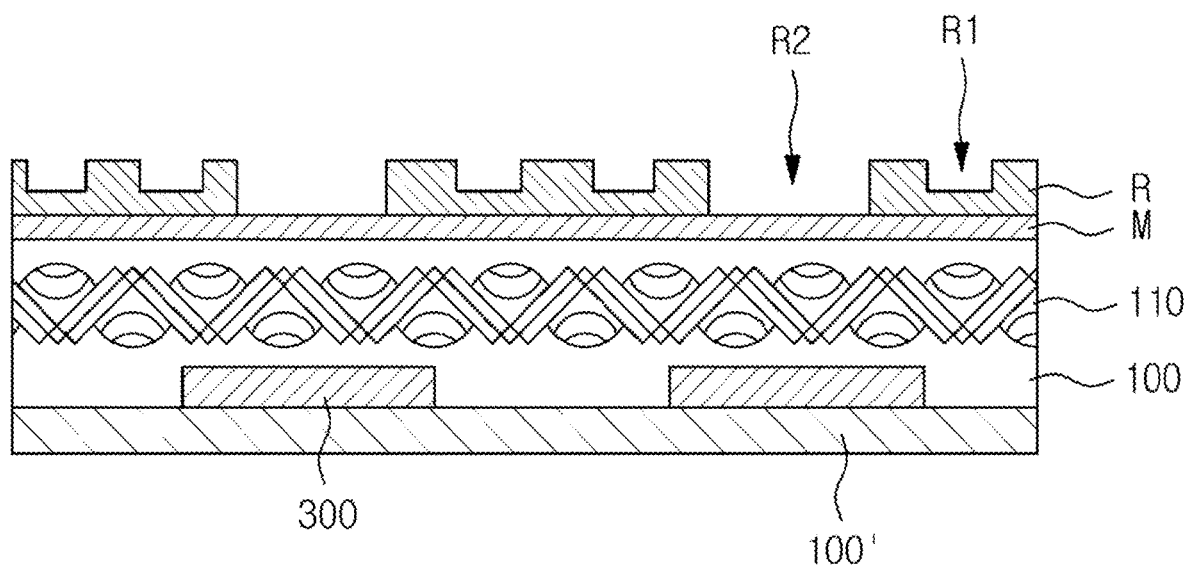
FIGS. 8 to 15 illustrate a method for manufacturing a printed circuit board according to an example.

Referring to FIG. 8, a first pad 300 is formed on an insulating layer 100', and an insulating material 100 that covers the first pad 300 is formed. A metal foil M may be stacked on the insulating material 100. A resist R is stacked on the metal foil M and is patterned. A thickness of the resist R may be 50 μm or more, but is not limited thereto. The patterned resist R may include openings with different depths. That is, a shallow opening R1 may partially, (not fully), penetrate through the resist R, and a deep opening R2 that fully penetrates through the resist R may each be provided in the resist R. A width of the shallow opening R1 may be smaller than a width of the deep opening R2. The shallow opening R1 may correspond to a portion of the circuit board at which a circuit 200 is to be formed, and the deep opening R2 may correspond to a portion of the circuit board at which a via 400 is to be formed.

The resist R may be photosensitive, and the opening of the resist R may be machined by exposure and development. An opening machining resolution may vary depending on a thickness of the resist R, and in an example where a pitch of openings is small with respect to the resolution, the openings may be the shallow openings R1 due to residues of the resist R. For example, in an example where the thickness of the resist R is 50 μm, the opening machining resolution (that is, a minimum pitch at which two openings may be machined so that the two openings may be distinguished from each other) may be 40 μm, and in an example where a pitch of two openings to be machined is 30 μm, the openings may be the shallow openings R1 due to residues of the resist R generated at a lower side of the openings.

Figure 9:
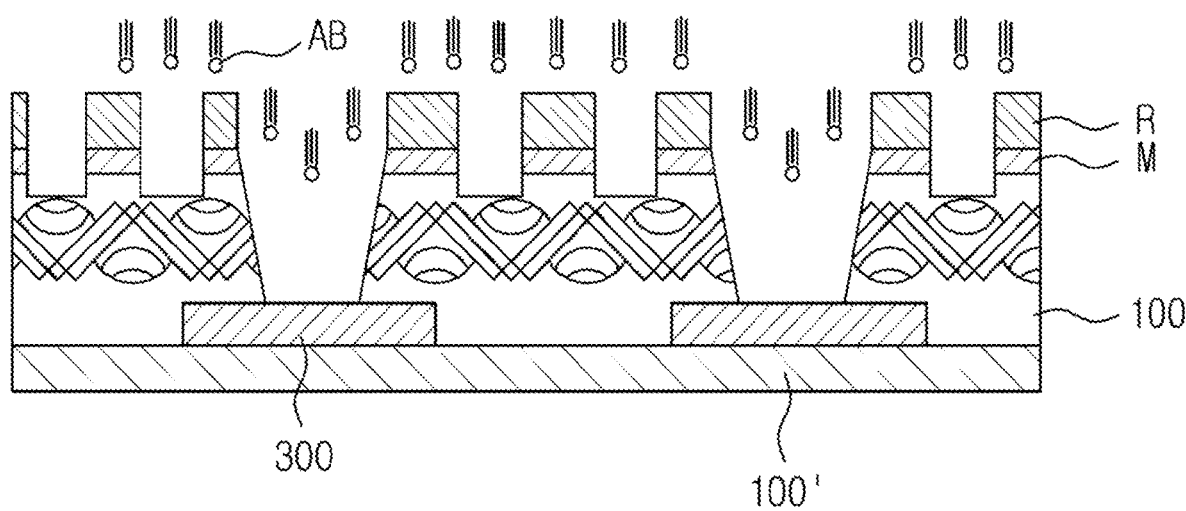

Referring to FIG. 9, the insulating material 100 and the metal foil M are subjected to the blasting operation in a state in which the patterned resist R is formed. The metal foil M and the insulating material 100 may be simultaneously machined by the blasting process to form a circuit hole H and a via hole VH.

The blasting process may be sandblasting. The sandblasting is a method of propelling abrasives (AB, micro powder) against a substrate for physical machining. As the abrasives, at least one of alumina ($Al_2O_3$) and silicon carbide (SiC) may be used. A nozzle from which the abrasives AB are sprayed may be divided into two types including a slit nozzle and a circular nozzle, and may be selected depending on physical properties of the insulating material 100 and the metal foil M. In addition, a machine for the blasting process may be divided into a suction type machine and direct pressure type machine, and may be selected depending on shapes of the circuit hole H and the via hole VH.

Since the metal foil M and the insulating material 100, which are heterogeneous materials, may be simultaneously machined by the blasting process, there is no need to remove the metal foil M in advance before machining the insulating material 100.

When two openings R1 and R2 are simultaneously subjected to the blasting process, the circuit hole H that partially penetrates through the insulating material 100 may be formed at the shallow opening R1, and the via hole VH that fully penetrates through the insulating material 100, and is formed on the first pad 300, may be formed at the deep opening R2. In an example where the insulating material 100 includes a fiber reinforcement material 110, the circuit hole H and the via hole VH may penetrate through the fiber reinforcement material 110.

The metal foil M and the insulating material 100 may be abraded by the abrasives AB propelled against the shallow opening R1 only after the remaining resist R is abraded, a depth of the circuit hole H is smaller than a depth of the via hole VH. In addition, since a width of the deep opening R2 is larger than a width of the shallow opening R1, circulation of abrasives AB propelled against the deep opening R2 may be more actively performed in comparison to circulation of abrasives AB propelled against the shallow opening R1, such that abrasion is rapidly performed. As a result, the depth of the circuit hole H is smaller than the depth of the via hole VH.

Figure 10A:
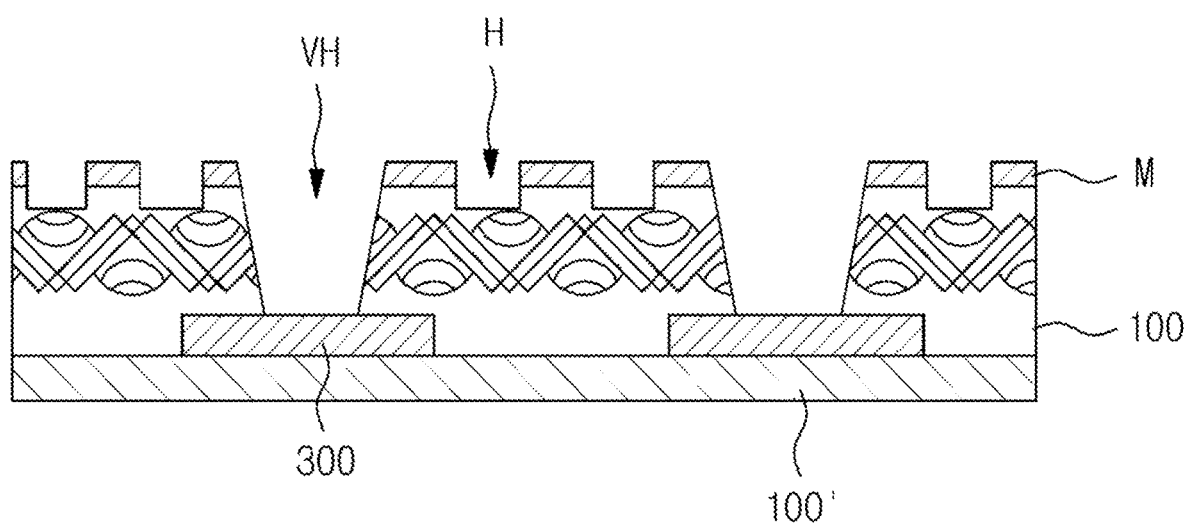
Figure 10B:
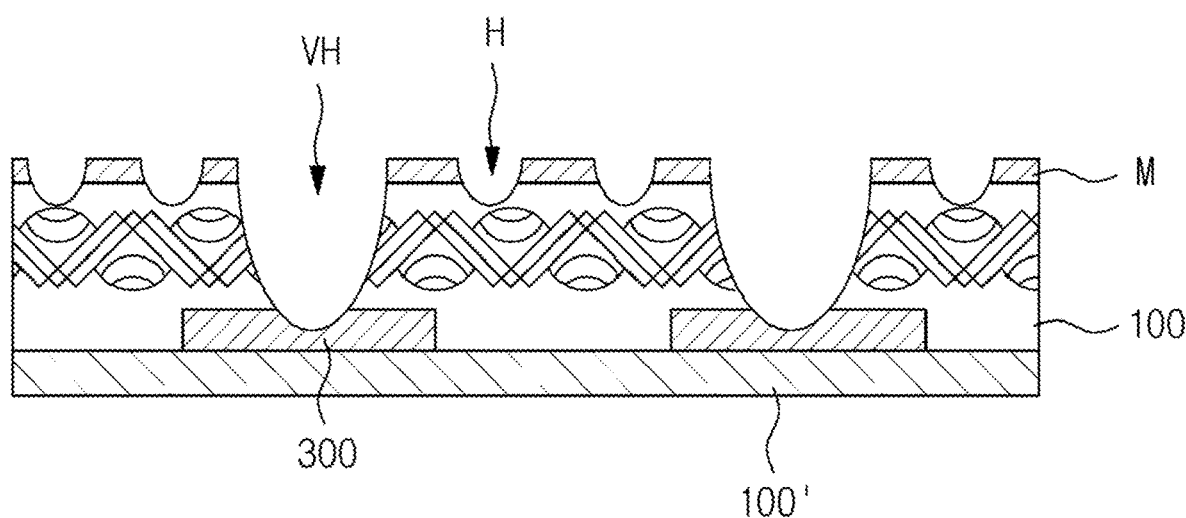

Referring to FIGS. 10A and 10B, the resist R is removed after the machining of the circuit hole H and the via hole VH is completed. As illustrated in FIG. 10A, an inner surface of each of the circuit hole H and the via hole VH may be formed to be straight in each of vertical cross sections of the circuit hole H and the via hole VH. Alternatively, as illustrated in FIG. 10B, an inner surface of each of the circuit hole H and the via hole VH may be a concavely curved (U-letter shape) surface so that the inner surface of each of the circuit hole H and the via hole VH may be curved in each of vertical cross sections of the circuit hole H and the via hole VH.

Referring to FIG. 10A, in an example, the via hole VH may not penetrate through the first pad 300. However, referring to FIG. 10B, in another example, the via hole VH may penetrate through the first pad 300, and an upper surface of the first pad 300 may include a concavely (U-letter shape) curved surface as illustrated in FIG. 10B.

Figure 11:
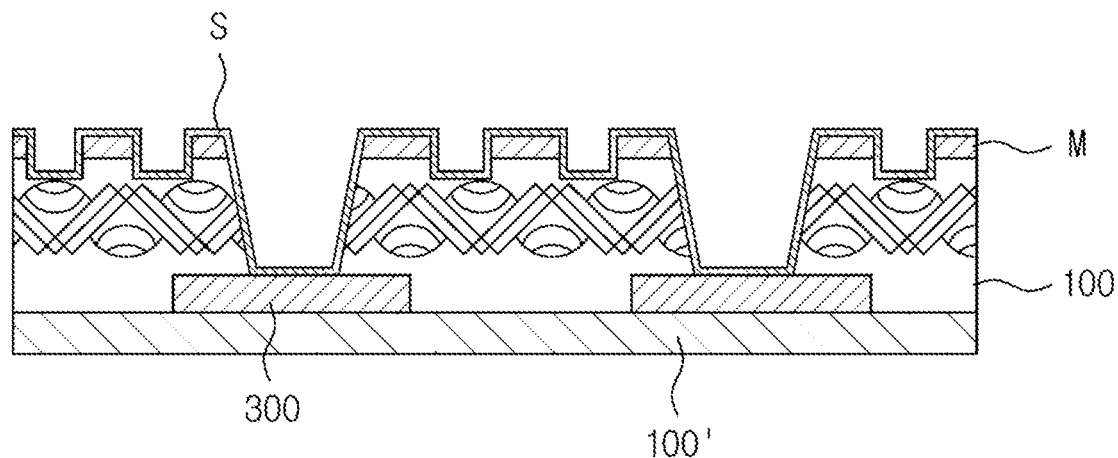

Referring to FIG. 11, an electroless plating layer S may be continuously formed on the inner surfaces of the circuit hole H and the via hole VH, and on an upper surface of the metal foil M. The electroless plating layer S may be formed by an electroless plating method, and may be grown from a catalyzed surface. A thickness of the electroless plating layer S may be 5 μm or less.

Figure 12:
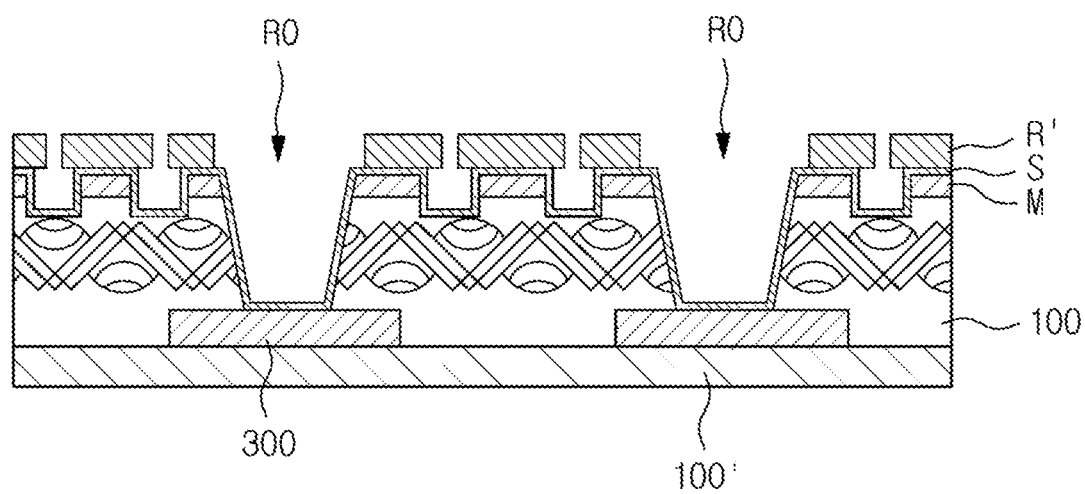

Referring to FIG. 12, a second resist R' may be formed on the metal foil M, a plurality of opening regions RO may be formed in the second resist R', and the plurality of opening regions RO may be disposed on the circuit hole H or the via hole VH. Since the opening region RO on the circuit hole H has a width that is smaller than the width of the circuit hole H, the second resist R' covers an edge of the circuit hole H, whereas since the opening region RO on the via hole VH has a width larger than the width of the via hole VH, the second resist R' does not cover the via hole VH.

Figure 13:
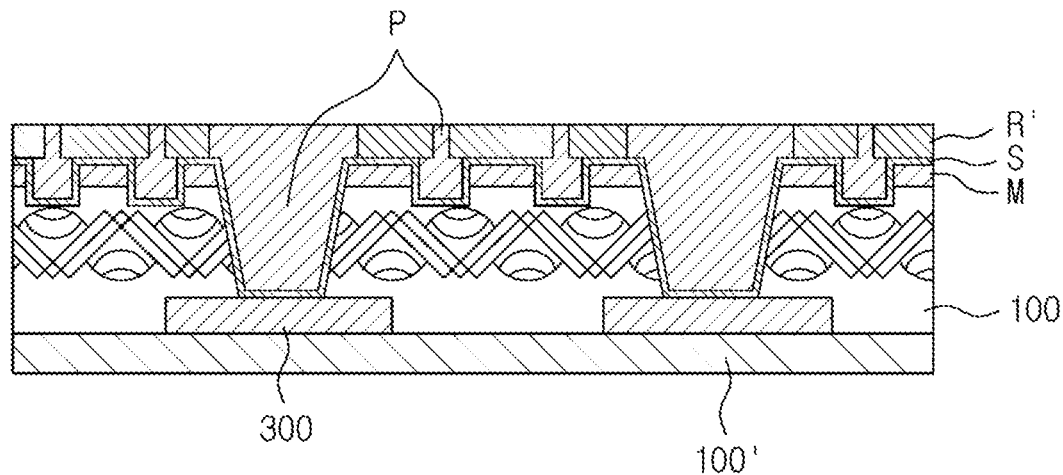

Referring to FIG. 13, an electroplating layer P may be formed in the circuit hole H, the via hole VH, and the opening region RO. The electroplating layer P may be formed by an electroplating method. According to the electroplating method, the electroplating layer P may be grown from the electroless plating layer S in an electrolyte.

Figure 14:
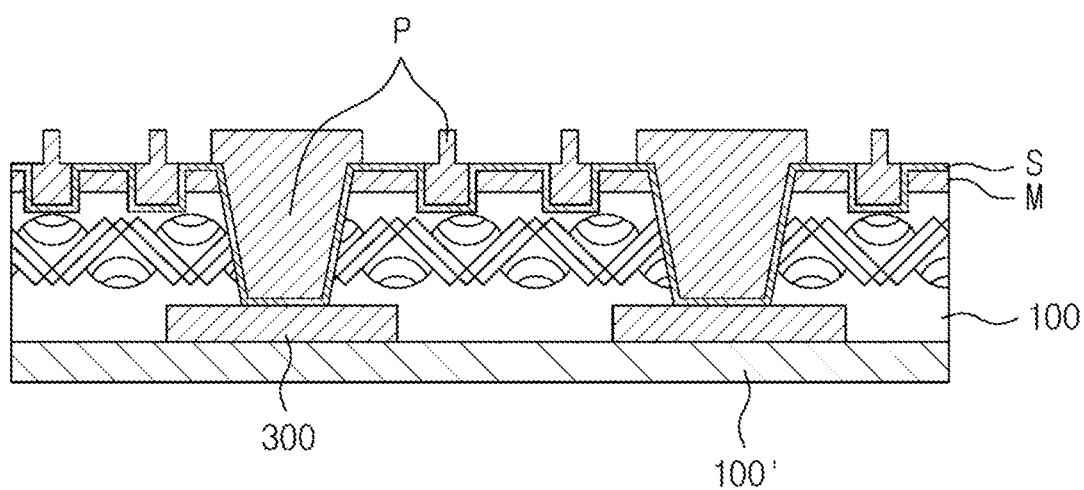

Referring to FIG. 14, the second resist R' is removed.

Figure 15:
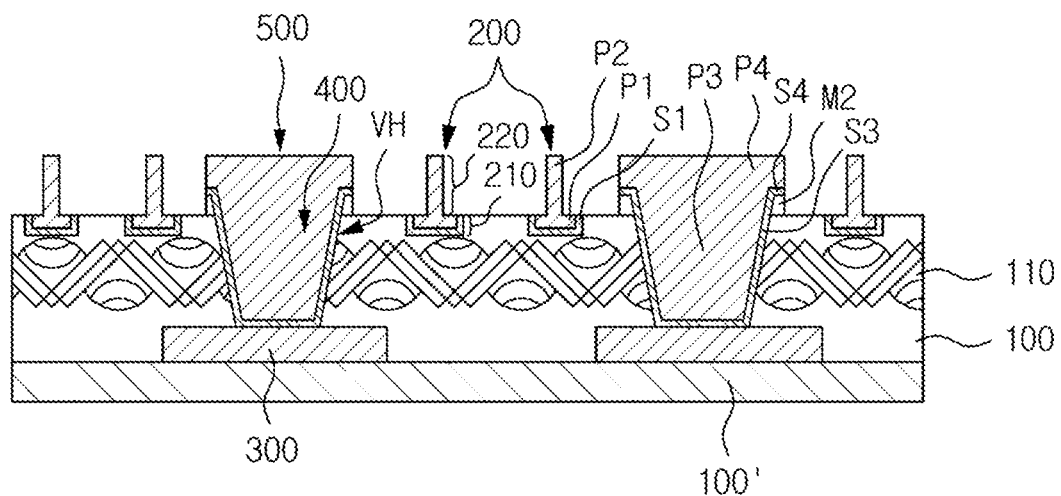

Referring to FIG. 15, the metal foil M and the electroless plating layer S are partially removed, respectively. The metal foil M and the electroless plating layer S may be removed by etching. As a result, the printed circuit board according to the example may be manufactured.

Figure 16:
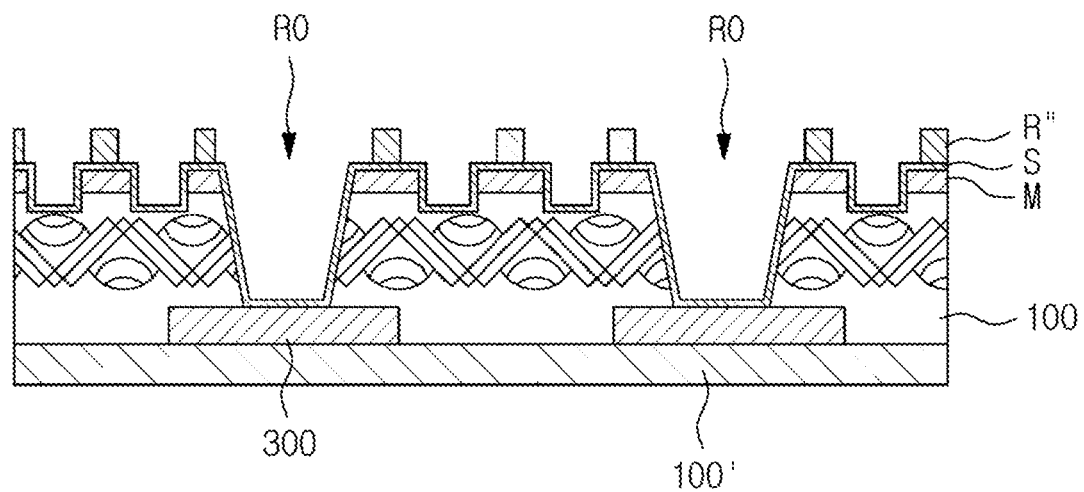
FIGS. 16 to 19 illustrate a method for manufacturing a printed circuit board according to an example.

FIGS. 16 to 19 illustrate a method for manufacturing a printed circuit board according to another example. FIG. 16 may be understood as illustrating a step following the step previously illustrated in FIG. 11.

Referring to FIG. 16, a second resist R" is formed on the metal foil M, a plurality of opening regions RO is formed in the second resist R', and the plurality of opening regions RO may be disposed on the circuit hole H or the via hole VH. The opening region RO on the circuit hole H has a width larger than the width of the circuit hole H. The opening region RO on the via hole VH may have a width larger than the width of the via hole VH. That is, the plurality of opening regions RO may be formed so that the second resist R" does not cover the circuit hole H and the via hole VH.

Figure 17:
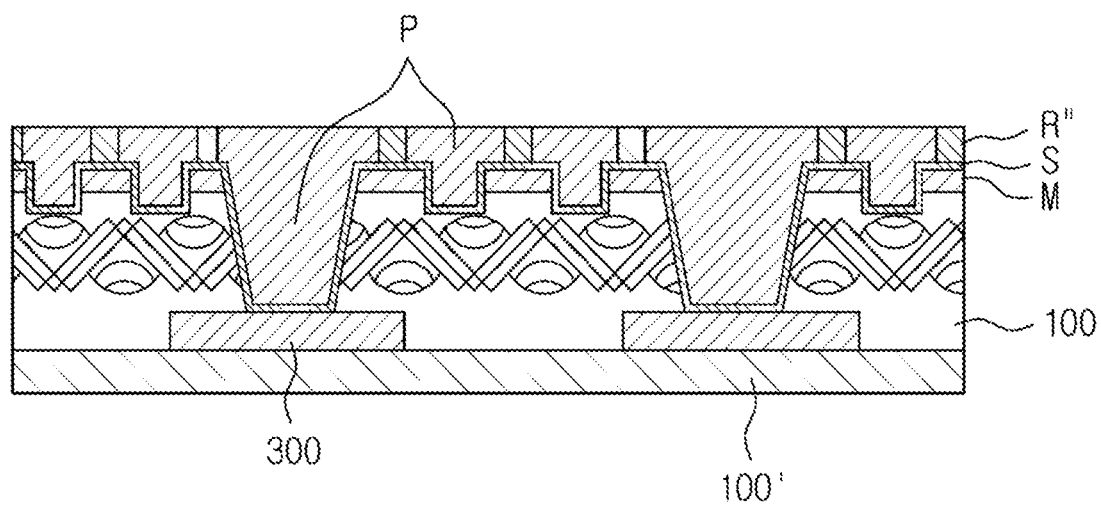

Referring to FIG. 17, an electroplating layer P may be formed in the circuit hole H, the via hole VH, and the opening region RO.

Figure 18:
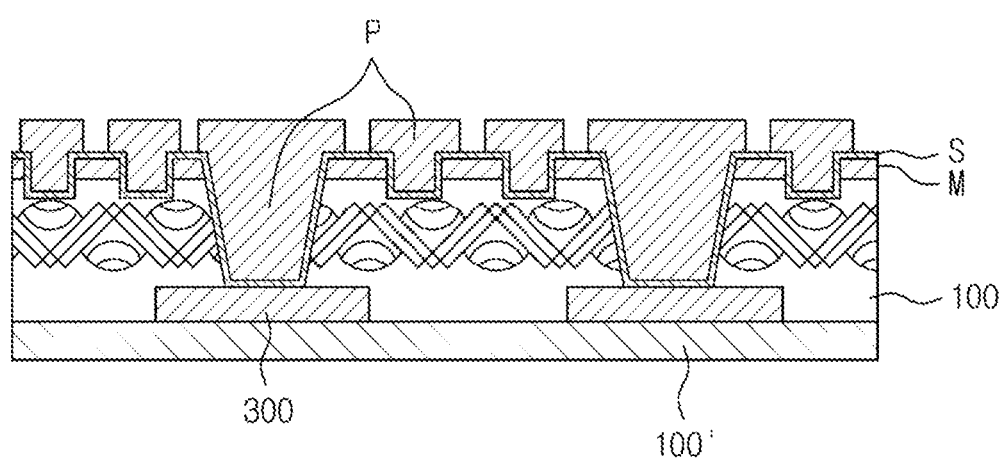

Referring to FIG. 18, the second resist R" is removed.

Figure 19:
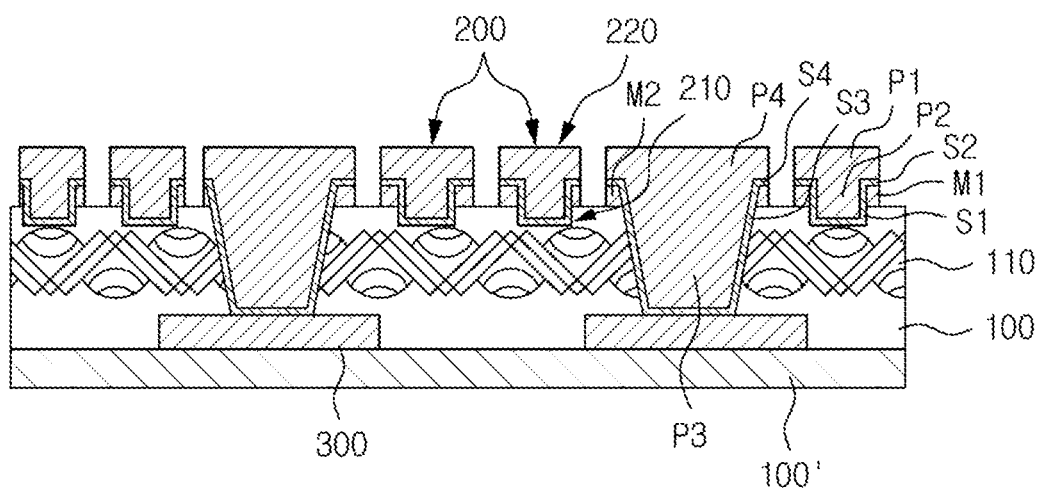

Referring to FIG. 19, the metal foil M and the electroless plating layer S are partially removed, respectively. The metal foil M and the electroless plating layer S may be removed by etching. As a result, the printed circuit board according to the example may be manufactured.

Figure 20:
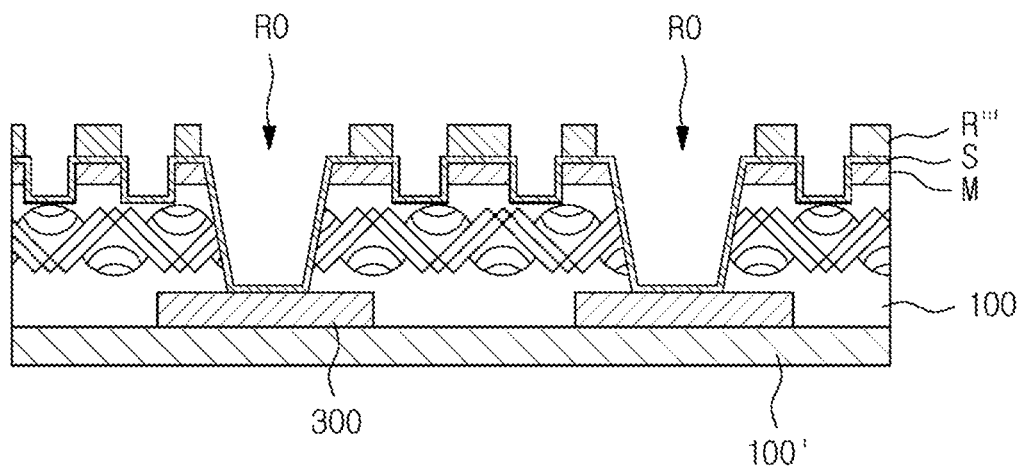
FIGS. 20 to 23 illustrate a method for manufacturing the printed circuit board according to an example.

FIGS. 20 to 23 illustrate a method for manufacturing the printed circuit board according to an example. FIG. 20 may be understood as illustrating a step following the step illustrated in FIG. 11.

Referring to FIG. 20, a third resist R''' is formed on the metal foil M, a plurality of opening regions RO may be formed in the third resist R''', and the plurality of opening regions RO may be disposed on the circuit hole H or the via hole VH. The plurality of opening regions RO may be formed so that the third resist R''' does not cover the circuit hole H and the via hole VH.

In detail, the opening region RO on the circuit hole H may have a width larger than the width of the circuit hole H. It should be noted that a difference between the width of the circuit hole H and the width of the opening region RO may be the same as a thickness of the electroless plating layer S. The opening region RO on the via hole VH may have a width larger than the width of the via hole VH. The difference between the width of the circuit hole H and the width of the opening region RO may be equal to or larger than the thickness of the electroless plating layer S.

Figure 21:
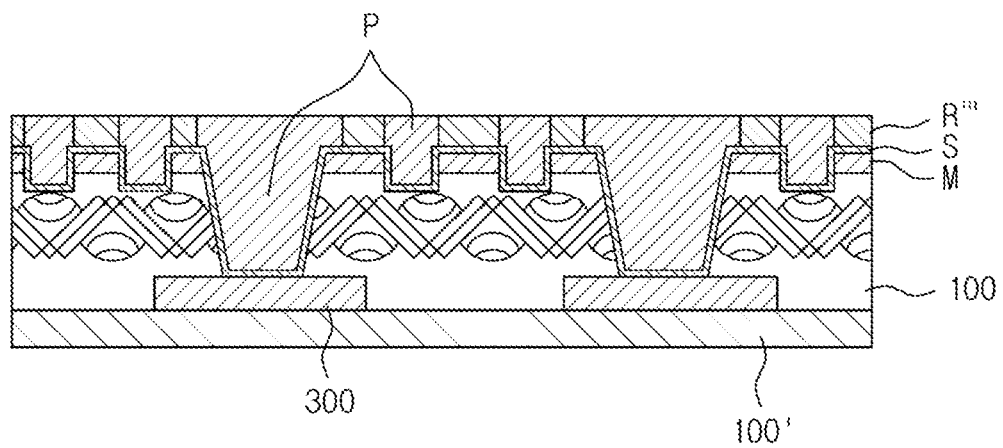

Referring to FIG. 21, an electroplating layer P may be formed in the circuit hole H, the via hole VH, and the opening region RO.

Figure 22:
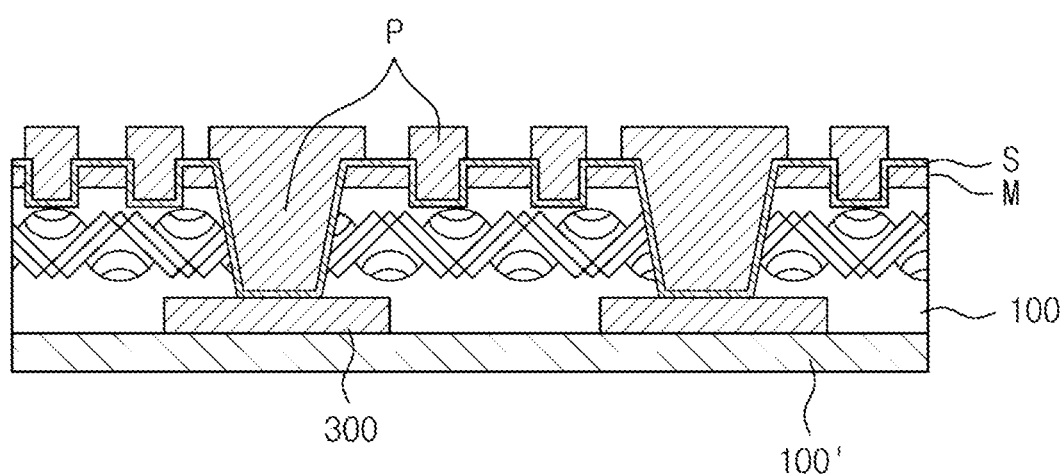

Referring to FIG. 22, the third resist R''' is removed.

Figure 23:
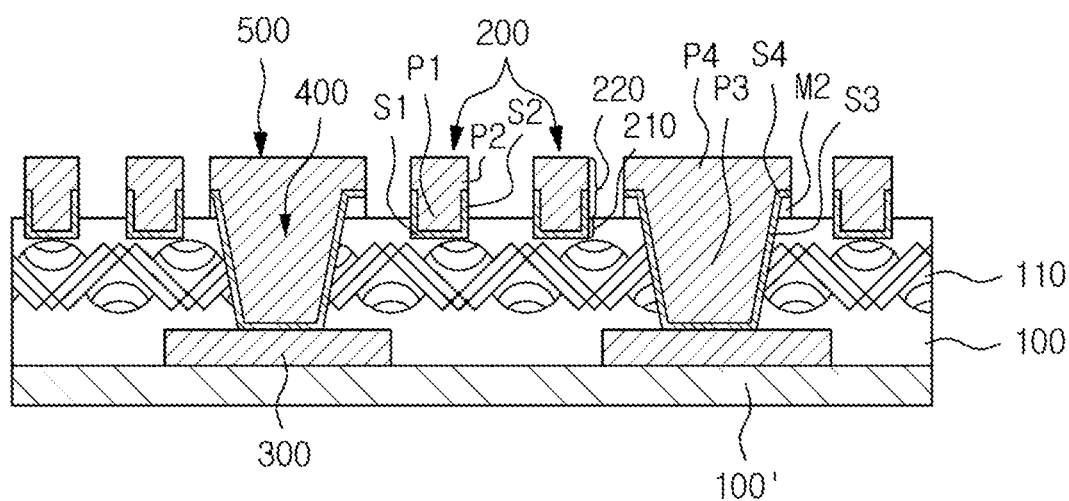

Referring to FIG. 23, the metal foil M and the electroless plating layer S are partially removed, respectively. The metal foil M and the electroless plating layer S may be removed by etching. As a result, the printed circuit board according to the example may be manufactured.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
    an insulating material;
    a circuit comprising a first region that partially penetrates the insulating material, and a second region formed on the first region and that protrudes from an upper portion of the insulating material; and
    a first pad formed in a lower surface of the insulating material to be spatially separate from the first region;
    wherein the first region comprises a first electroplating layer and a first electroless plating layer that is disposed within the insulating material, and is formed between the insulating material and the first electroplating layer.

2. The printed circuit board of claim 1, wherein a width of the first region is larger than a width of the second region.

3. The printed circuit board of claim 2, wherein the second region comprises a second electroplating layer formed integrally with the first electroplating layer on an upper surface of the first electroplating layer.

4. The printed circuit board of claim 3, wherein a width of the second electroplating layer is smaller than a width of the first electroplating layer.

5. The printed circuit board of claim 1, wherein a width of the first region is smaller than a width of the second region.

6. The printed circuit board of claim 5, wherein the second region comprises
a second electroplating layer formed integrally with the first electroplating layer on an upper surface of the first electroplating layer,
a metal foil disposed along a circumference of a part of an outer portion of the second electroplating layer, and formed on an upper surface of the insulating material, and
a second electroless plating layer formed between the second electroplating layer and the metal foil, and further formed in an integral manner with the first electroless plating layer.

7. The printed circuit board of claim 1, wherein a width of the first region is the same as a width of the second region.

8. The printed circuit board of claim 7, wherein the second region comprises
a second electroplating layer formed in an integral manner with the first electroplating layer on an upper surface of the first electroplating layer, and
a second electroless plating layer disposed along a circumference of a part of an outer portion of the second electroplating layer, and formed in an integral manner with the first electroless plating layer.

9. The printed circuit board of claim 8, wherein a height of the second electroplating layer is larger than a height of the second electroless plating layer.

10. The printed circuit board of claim 1, wherein a boundary surface between the first region and the insulating material is a concavely curved surface.

11. The printed circuit board of claim 1, further comprising:
a via hole, disposed spatially separate from the first region and the second region, the via hole being formed on the first pad, and configured to penetrate the insulating material;
a via formed in the via hole; and
a second pad formed on an upper surface of the via.

12. The printed circuit board of claim 11, wherein a thickness of the via is larger than a thickness of the first region, and a thickness of the second region is the same as a thickness of the second pad.

13. The printed circuit board of claim 11, wherein the first region is connected to the via, and the second region is connected to the second pad.

14. The printed circuit board of claim 11, wherein the via comprises a third electroless plating layer formed on an inner surface of the via hole and an upper surface of the first pad, and a third electroplating layer formed on the third electroless plating layer.

15. The printed circuit board of claim 14, wherein the second pad comprises
a fourth electroplating layer formed in an integral manner with the third electroplating layer on an upper surface of the third electroplating layer,
a metal foil disposed along a circumference of a part of an outer portion of the third electroplating layer and further formed on an upper surface of the insulating material, and
a fourth electroless plating layer formed between the third electroplating layer and the metal foil and further formed in an integral manner with the third electroless plating layer.

16. The printed circuit board of claim 11, wherein the via hole has a concavely curved surface.

17. The printed circuit board of claim 11, wherein the via hole penetrates an upper portion of the first pad.

18. The printed circuit board of claim 11, wherein the electroless plating layer is formed to surround side surfaces and a lower surface of the electroplating layer.

19. The printed circuit board of claim 1, further comprising a via hole, disposed on the first pad, and disposed spatially separate from the first region and the second region.

20. A method of manufacturing a printed circuit board, the method comprising:
forming a flexible insulating layer;
forming a circuit comprising a first region that partially penetrates the flexible insulating layer, and a second region formed on the first region, and that protrudes from an upper portion of the flexible insulating layer, and
forming a first pad in a lower surface of the flexible insulating layer to be spatially separate from the first region;
wherein the first region comprises a first electroplating layer and a first electroless plating layer that is disposed within the flexible insulating material, and is formed between the flexible insulating layer and the first electroplating layer.

* * * * *